United States Patent
Wu

(10) Patent No.: US 9,230,954 B1
(45) Date of Patent: Jan. 5, 2016

(54) LDNMOS DEVICE FOR AN ESD PROTECTION STRUCTURE

(71) Applicant: UNITED MICROELECTRONICS CORPORATION, Hsinchu (TW)

(72) Inventor: Chi-Hong Wu, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/716,925

(22) Filed: May 20, 2015

(51) Int. Cl.
| H01L 23/62 | (2006.01) |
| H01L 27/02 | (2006.01) |
| H01L 29/78 | (2006.01) |
| H01L 29/06 | (2006.01) |
| H01L 29/10 | (2006.01) |

(52) U.S. Cl.
CPC ........ *H01L 27/0266* (2013.01); *H01L 29/0619* (2013.01); *H01L 29/0653* (2013.01); *H01L 29/1079* (2013.01); *H01L 29/1095* (2013.01); *H01L 29/7823* (2013.01)

(58) Field of Classification Search
CPC ............ H01L 27/0248; H01L 27/0251; H01L 27/0266; H01L 29/785
USPC .................................................. 257/355, 401
See application file for complete search history.

(56) References Cited

U.S. PATENT DOCUMENTS

| 8,704,312 B2 | 4/2014 | Cheng | |
| 2013/0183821 A1* | 7/2013 | Pan | H01L 29/401 438/592 |

* cited by examiner

*Primary Examiner* — Hoai V Pham
(74) *Attorney, Agent, or Firm* — Ding Yu Tan

(57) ABSTRACT

The present invention provides a LDNMOS device for an ESD protection structure, by means of disposing a metal portion above the isolation portion and overlapping thereof, so as to protect the internal device from ESD more completely, comprising: a substrate; an ILD; a deep N-well region; a P-body region; a doped region, the doped region defines a diffusion area on the top thereof; a Poly gate electrode; an isolation structure disposed between the Poly gate electrode and the doped region; a contact portion connecting to the diffusion area of the doped region; and a metal portion disposed above the doped region, connecting to the contact portion. Wherein there is an overlap between the isolation structure and the metal portion, the direction of the overlap is parallel to the direction of channel length.

9 Claims, 4 Drawing Sheets

US 9,230,954 B1

LDNMOS DEVICE FOR AN ESD PROTECTION STRUCTURE

FIELD OF THE INVENTION

The invention relates to a Lateral Diffused N-type Metal Oxide semiconductor (LDNMOS) device for an ESD (Electrostatic Discharge) protection structure.

BACKGROUND OF THE INVENTION

ESD is a phenomenon of electrostatic motion along a non-conductive surface. Semiconductor devices and circuits in ICs may be damaged by ESD. For example, a charge carrying object, such as a human body walking on a carpet, a machine for packaging ICs or an apparatus for testing ICs, may discharge static electricity to the IC chip when they are in contact with each other. Thus, the IC chip is apt to be damaged or broken by the transient power of ESD.

Meanwhile, ESD is a transient process of high energy transformation from external to internal of an integrated circuit (IC) when the IC is floated. Hundreds or even thousands of volts are transferred during ESD. Such high voltage transformation is a common failure mechanism that is seen on integrated circuit devices. Due to the ever increasing shrinkage in transistor geometries, prevention of ESD damage will become increasingly important.

Currently, a LDNMOS device is an electronic device widely applied in the power management. When the internal device is a high voltage device such as a large-sized output driver, the output driver is coupled to a control circuit, and a gate-grounded LDNMOS device is used as an ESD protection device. The current LDNMOS ESD devices for high voltage process are almost manufactured by means of shortening the dimension of isolation structure, such as FOX (Field Oxide), so as to gain a lower breakdown voltage. However, this kind of shortening the dimension of the FOX is apt or prone to result in the problem of failure of the reliability.

Accordingly, it is preferable to design an LDNMOS device which can protect the internal device from ESD more completely.

SUMMARY OF THE INVENTION

It is one object of the present invention to provide an LDNMOS device, by means of disposing a metal portion above the isolation portion and partially overlapping thereof, so as to protect the internal device from ESD more completely.

To achieve the foregoing objects, the present invention provides a LDNMOS device for an ESD protection structure, comprising: a substrate of a first conductivity type (P-type); an ILD (Interlayer Dielectric) disposed on the substrate; a deep N-well region of a second conductivity type, disposed in the substrate; a P-body region of the first conductivity type, disposed in the substrate; a first doped region of the second conductivity type, disposed in the deep N-well region, the first doped region defines a first diffusion area on the top thereof; a second doped region of the second conductivity type, disposed in the P-body region; a third doped region of the first conductivity type, disposed in the P-body region; a Poly gate electrode, disposed in the ILD, and disposed between the first doped region and the second doped region; a first isolation structure, disposed between the Poly gate electrode and the first doped region; a first contact portion, disposed in the ILD, connecting to the first diffusion area of the first doped region; and a first metal portion disposed above the first doped region, connecting to the first contact portion; wherein there is an overlap between the first isolation structure and the first metal portion, the direction of the overlap is parallel to the direction of channel length.

In one embodiment of the present invention, further comprising: a lightly doped P-doped well disposed in the substrate; a fourth doped region of the first conductivity type, disposed in the lightly doped P-doped well; a second isolation structure, disposed between the third doped region and the fourth doped region; a second contact portion, disposed in the ILD, connecting to the second doped region and the third doped region; and a second metal portion disposed above the second doped region and the third doped region, connecting to the second contact portion; wherein the lightly doped P-doped well is a HVPW (High Voltage P-type Well), the HVPW is a guard ring for shielding the device from ESD, comprising the fourth doped region as a contact region.

In one embodiment of the present invention, the width of the overlap between the first isolation structure and the first metal portion is longer than 0.5 width of the isolation structures.

In one embodiment of the present invention, the width of the overlap between the first isolation structure and the first metal portion is less than 0.75 width of the isolation structures.

In one embodiment of the present invention, the isolation structure is a FOX (Field oxide) or STI (Shallow trench Isolation).

In one embodiment of the present invention, the width of the metal portion is adjustable.

In one embodiment of the present invention, after adjusting the width of the metal portion, the overlap width and the breakdown voltage is at an inverse ratio.

In one embodiment of the present invention, further comprising a N-grade region of the second conductivity type, disposed in the deep N-well region, the first doped region is disposed in the N-grade region.

Accordingly, the present invention provides an LDNMOS device, by disposing a metal portion above the isolation portion and overlapping thereof, so as to effectively protect the internal device from ESD.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
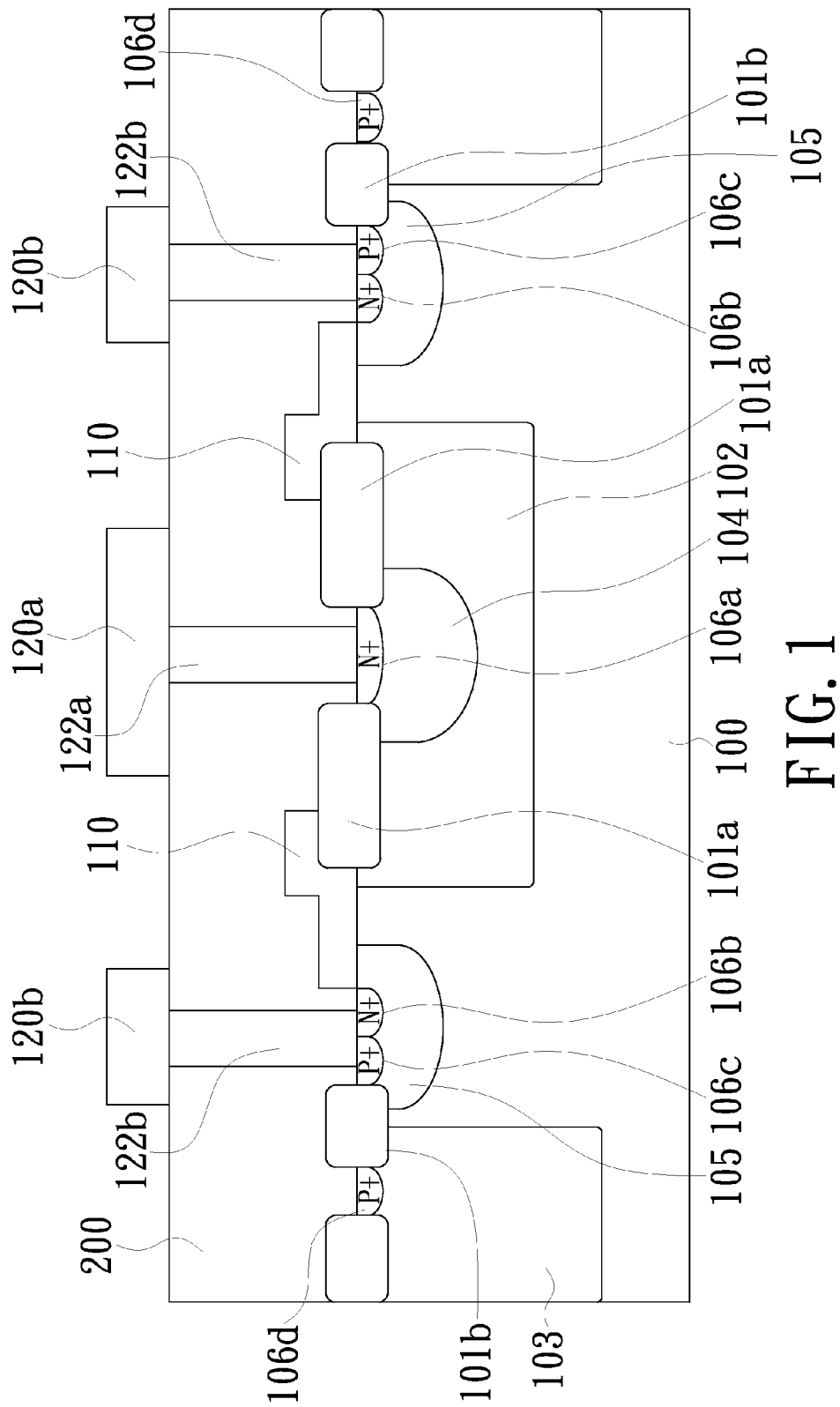
FIG. 1 is a cross-sectional view diagram of a LDNMOS device for an ESD protection structure of an embodiment of the present invention.

FIG. 1 is a cross-sectional view diagram of a LDNMOS device for an ESD protection structure according to an embodiment of present invention. The LDNMOS device for the ESD protection structure, comprising: a substrate 100 of a first conductivity type, the first conductivity type is defined as P-type; an ILD 200 disposed on the substrate 100; a deep N-well region 102 of a second conductivity type, the second conductivity type is defined as N-type, disposed in the substrate 100; a P-body region 105 of the first conductivity type, disposed in the substrate 100; a first doped region 106a of the second conductivity type, disposed in the deep N-well region 102, functioned as a drain side, the first doped region 106a defines a first diffusion area on the top thereof; a second doped region 106b of the second conductivity type, disposed in the P-body region 105, functioned as a source side; a third doped region 106c of the first conductivity type, disposed in the P-body region 105; a poly gate electrode 110, disposed in the ILD 200, and disposed between the first doped region 106a and the second doped region 106b; a first isolation structure 101a, disposed between the poly gate electrode 110 and the first doped region 106a; a first contact portion 122a, disposed in the ILD 200, connecting to the first diffusion area 210a of the first doped region 106a; and a first metal portion 120a disposed above the first doped region 106a, connecting to the first contact portion 122a; wherein there is an overlap between the first isolation structure 101a and the first metal portion 120a, the direction of the overlap is parallel to the direction of channel length.

Preferably, the width of the overlap between the first isolation structure 101a and the first metal portion 120a is longer than 0.5 width of the first isolation structure 101a.

Preferably, the width of the overlap is less than 0.75 width of the first isolation structure 101a.

In one embodiment, the first isolation structure 101a is a FOX. The FOX can increase the field oxide threshold voltages, for usually a specific channel-stop implant dose under the FOX. Alternatively, the threshold voltages can be maintained at a constant value while the channel-stop implant dose can be reduced, which results in lower leakage currents between device areas.

In one embodiment, the first isolation structure 101a is a STI (Shallow trench Isolation). The effect of the STI has given rise to what has recently been termed the "reverse narrow channel effect" or "inverse narrow width effect". Basically, due to the electric field enhancement at the edge, it is easier to form a conducting channel at a lower voltage. The threshold voltage is effectively reduced for a narrower transistor width. However, the main concern for electronic devices is the resulting threshold leakage current, which is substantially larger after the threshold voltage reduction.

However, either when the first isolation structure 101a is FOX or STI, an object of the present invention is achieved by means of special layout of the metal portion, the LDNMOS device can lower the breakdown voltage without narrowing the dimension of the first isolation structure 101a, meanwhile, remaining to achieve the reliability of protecting the internal device.

Preferably, the LDNMOS device further comprising: a N-grade region 104 of the second conductivity type, disposed in the deep N-well region 102, the first doped region 106a is disposed in the N-grade region 104.

Preferably, the width of the first metal portion 120a is adjustable.

After adjusting the width of the first metal portion 120a, the longer the overlap width between the first metal portion 120a and the first isolation portion 101a, under the circumstance of not changing the dimension of the first isolation portion 101a, the more the first metal portion 120a along with the first isolation portion 101a can shield the internal device from the damage by ESD, so as to lower the breakdown voltage, and vice versa. Therefore, the overlap width and the breakdown voltage is at an inverse ratio.

Accordingly, by means of disposing the first metal portion 120a above the doped regions and partially overlapping the first isolation portion 101a, the present invention can effectively protect the internal device from ESD.

In one embodiment, as shown in FIG. 1, the LDNMOS device further comprising: a lightly doped P-doped well 103 disposed in the substrate 100; a fourth doped region 106d of the first conductivity type, disposed in the lightly doped P-doped well 103; a second isolation structure 101b, disposed between the third doped region 106c and the fourth doped region 106d; a second contact portion 122b, disposed in the ILD 200, connecting to the second doped region 106b and the third doped region 106c; and a second metal portion 120b disposed above the second doped region 106b and the third doped region 106c, connecting to the second contact portion 122b; wherein the lightly doped P-doped well 103 is a High Voltage P-type Well (HVPW).

Preferably, the HVPW is functioned as a guard ring for shielding the internal device from ESD, comprising the fourth doped region 106d as a contact region.

Accordingly, by means of the HVPW functioning as a guard ring for shielding the external electronic penetration damage, the present invention can more effectively protect the internal device from ESD.

Various modifications and similar arrangements made by persons with ordinary skills in the art are still within the scope of the present invention.

Figure 2:
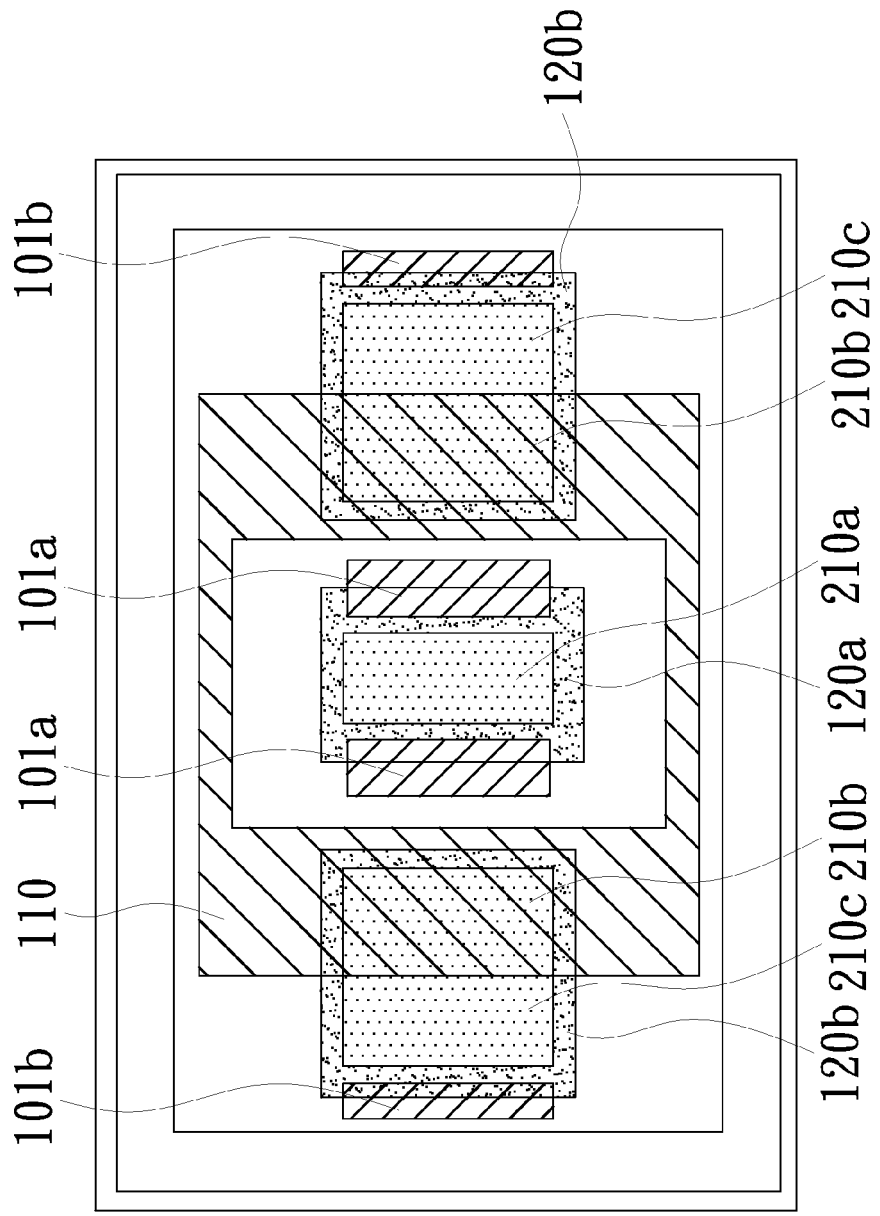
FIG. 2 is a top plan view of the LDNMOS device of FIG. 1 according to the embodiment of the present invention.
Figure 3:
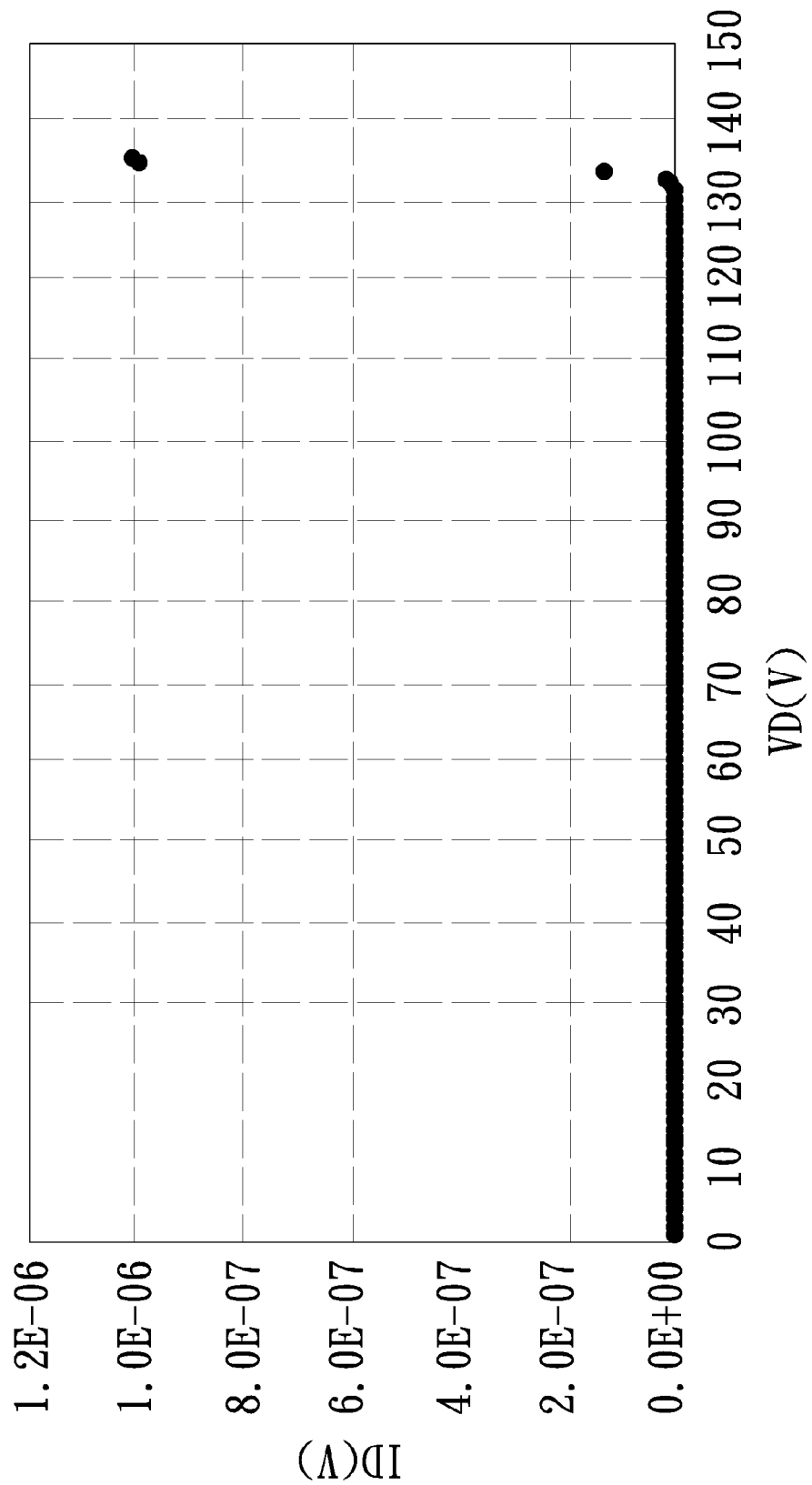
FIG. 3 is a table according to the experiment result of overlap width between the first isolation structure and the first metal portion is 0.7 μm.
Figure 4:
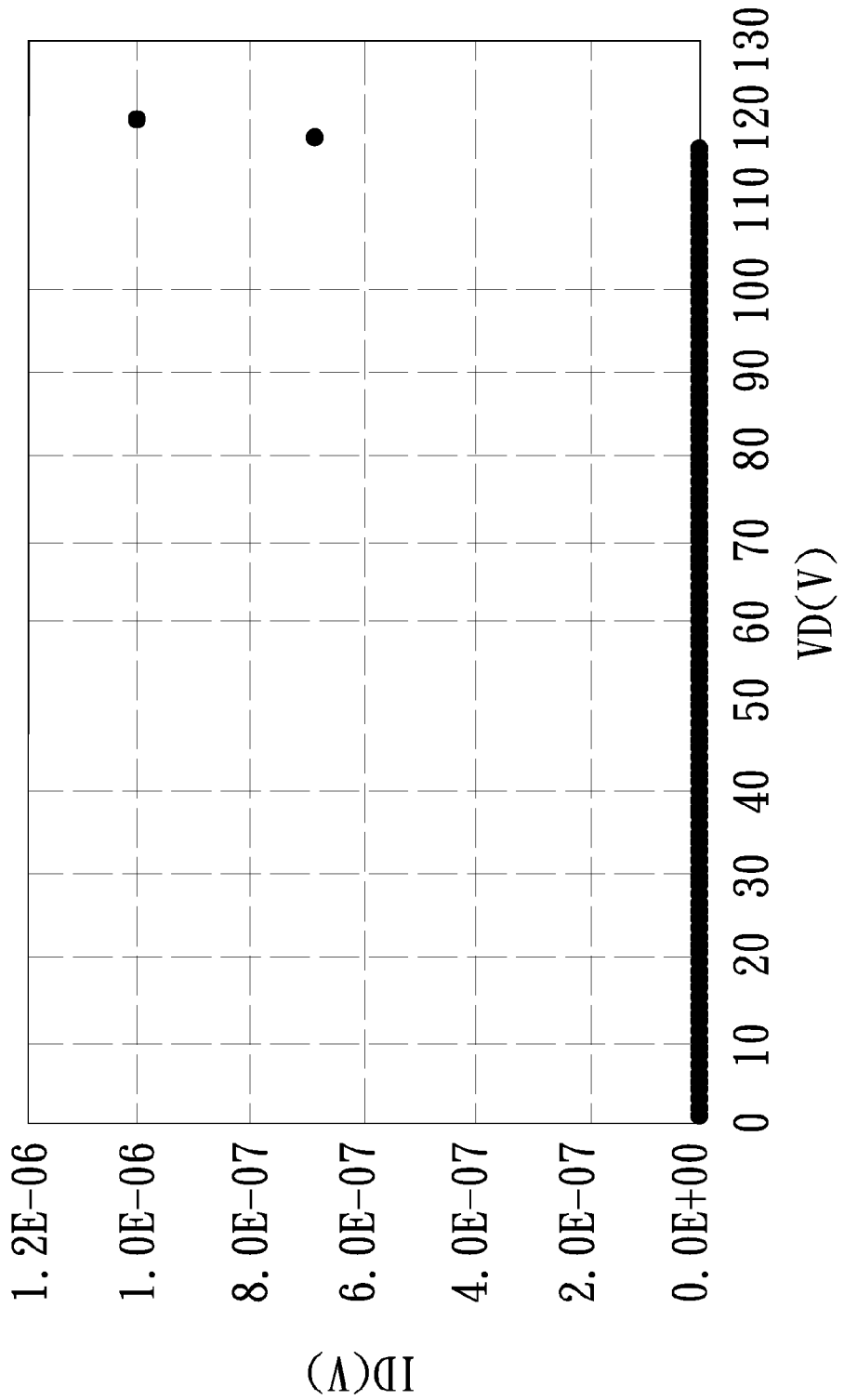
FIG. 4 is a table according to the experiment result of overlap width between the first isolation structure and the first metal portion is 2.7 μm.

FIG. 2 is a top plan view of the LDNMOS device of FIG. 1 of the embodiment of present invention. The LDNMOS device according to the embodiment shown in FIGS. 1 and 2 has the first metal portion 120a disposed above the first doped region 106a. The first doped region 106a defines a first diffusion area 210a on the top thereof. The second metal portion 120b is disposed above the second doped region 106b and the third doped region 106c.

FIG. 2 shows the top plan view of the distribution and layout of the isolation structures, the metal portions, the poly gate electrode, and the diffusion areas. The isolation structures including the first isolation structure 101a and the second isolation structure 101b. The metal portions include the first metal portion 120a and the second metal portion 120b.

With respect to the overlap area of the first isolation structure 101a and the first metal portion 120a, according to the top plan view, the first metal portion 120a partially overlaps the first isolation structure 101a.

By means of the special layout of the metal portions, the present invention provides the LDNMOS device that can lower the breakdown voltage without narrowing the dimension of the isolation structures, meanwhile, remain the reliability of protecting the internal device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Lateral Diffused N-type Metal Oxide Semiconductor (LDNMOS) device for an ESD protection structure, comprising:
　　a substrate of a first conductivity type;
　　an ILD disposed on the substrate;
　　a deep N-well region of a second conductivity type, disposed in the substrate;
　　a P-body region of the first conductivity type, disposed in the substrate;
　　a first doped region of the second conductivity type, disposed in the deep N-well region, the first doped region defines a first diffusion area on the top thereof;
　　a second doped region of the second conductivity type, disposed in the P-body region;
　　a third doped region of the first conductivity type, disposed in the P-body region;
　　a Poly gate electrode, disposed in the ILD, and disposed between the first doped region and the second doped region;
　　a first isolation structure, disposed between the Poly gate electrode and the first doped region;
　　a first contact portion, disposed in the ILD, connecting to the first diffusion area of the first doped region; and
　　a first metal portion disposed above the first doped region, connecting to the first contact portion;
　　wherein there is an overlap between the first isolation structure and the first metal portion, the direction of the overlap is parallel to the direction of channel length.

2. The LDNMOS device as claimed in claim 1, wherein the width of the overlap is longer than 0.5 width of the first isolation structure.

3. The LDNMOS device as claimed in claim 1, wherein the width of the overlap is less than 0.75 width of the first isolation structure.

4. The LDNMOS device as claimed in claim 1, wherein the first isolation structure is a FOX or STI.

5. The LDNMOS device as claimed in claim 1, wherein the width of the first metal portion is adjustable.

6. The LDNMOS device as claimed in claim 1, wherein after adjusting the width of the first metal portion, the overlap width and the breakdown voltage is at an inverse ratio.

7. The LDNMOS device as claimed in claim 1, wherein further comprising a N-grade region of the second conductivity type, disposed in the deep N-well region, the first doped region is disposed in the N-grade region.

8. The LDNMOS device as claimed in claim 1, wherein further comprising:
　　a lightly doped P-doped well disposed in the substrate;
　　a fourth doped region of the first conductivity type, disposed in the lightly doped P-doped well;
　　a second isolation structure, disposed between the third doped region and the fourth doped region;
　　a second contact portion, disposed in the ILD, connecting to the second doped region and the third doped region; and
　　a second metal portion disposed above the second doped region and the third doped region, connecting to the second contact portion;
　　wherein the lightly doped P-doped well is a High Voltage P-type Well (HVPW), the HVPW is a guard ring for shielding the device from ESD, comprising the fourth doped region as a contact region.

9. The LDNMOS device as claimed in claim 8, wherein the second isolation structure is a FOX or STI.

\* \* \* \* \*